(12) United States Patent
Okamoto et al.

(10) Patent No.: US 11,490,528 B2
(45) Date of Patent: Nov. 1, 2022

(54) METHOD FOR MANUFACTURING WIRING BOARD, AND WIRING BOARD

(71) Applicant: TOYOTA JIDOSHA KABUSHIKI KAISHA, Toyota (JP)

(72) Inventors: Kazuaki Okamoto, Toyota (JP); Hiroshi Yanagimoto, Miyoshi (JP); Rentaro Mori, Kasugai (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 92 days.

(21) Appl. No.: 17/017,984

(22) Filed: Sep. 11, 2020

(65) Prior Publication Data
US 2021/0084774 A1  Mar. 18, 2021

(30) Foreign Application Priority Data
Sep. 18, 2019 (JP) .............................. JP2019-168980

(51) Int. Cl.
*H05K 1/02* (2006.01)
*H05K 1/09* (2006.01)
(Continued)

(52) U.S. Cl.
CPC ............. *H05K 3/388* (2013.01); *H05K 3/205* (2013.01); *H05K 3/241* (2013.01)

(58) Field of Classification Search
CPC .. H05K 1/02; H05K 1/09; H05K 3/02; H05K 3/16; H05K 3/24; H05K 3/046; H05K 3/105; H05K 3/108; H05K 3/185; H05K 3/242; H05K 3/243; H05K 3/388; C23C 18/16; C23C 18/30; C23C 18/31; C23C 18/38; C23C 18/54; C23C 18/208; C25D 17/00; C25D 17/02; C25D 17/05;
(Continued)

(56) References Cited

U.S. PATENT DOCUMENTS 6,488,721 B1 *  12/2002  Carlson ............. H01M 10/0436
                                                          429/231.9
7,066,971 B1 *   6/2006  Carlson ............... H01M 4/1399
                                                          429/231.9
(Continued)

FOREIGN PATENT DOCUMENTS

EP   3 037 571 A1   6/2016
GB   1241574 A      8/1971
(Continued)

*Primary Examiner* — Xiaoliang Chen
(74) *Attorney, Agent, or Firm* — Dickinson Wright, PLLC

(57) ABSTRACT

Provided is a method for manufacturing a wiring board that forms a wiring layer having favorable adhesion without a resin resist pattern. A method prepares a substrate with seed-layer including: a underlayer on the surface of an insulating substrate; and a seed layer on the surface of the underlayer, the seed layer having a predetermined pattern and containing metal; presses a solid electrolyte membrane against the seed layer and the underlayer, and applies voltage between an anode and the underlayer to reduce metal ions in the membrane and form a metal layer on the surface of the seed layer; and removes an exposed region without the seed layer and the metal layer of the underlayer to form a wiring layer including the underlayer, the seed layer and the metal layer on the surface of the substrate.

7 Claims, 13 Drawing Sheets

(51) Int. Cl.
- *H05K 3/02* (2006.01)
- *H05K 3/16* (2006.01)
- *H05K 3/24* (2006.01)
- *H05K 3/46* (2006.01)
- *C23C 18/16* (2006.01)
- *C23C 18/30* (2006.01)
- *C23C 18/31* (2006.01)
- *C23C 18/38* (2006.01)
- *C23C 18/54* (2006.01)
- *C25D 17/00* (2006.01)
- *C25D 17/02* (2006.01)
- *H01M 6/00* (2006.01)
- *H01M 10/04* (2006.01)
- *H01M 10/36* (2010.01)
- *H05K 3/38* (2006.01)
- *H05K 3/20* (2006.01)

(58) Field of Classification Search
CPC ........ H01M 6/00; H01M 6/181; H01M 10/04; H01M 10/36
USPC ............. 174/257; 250/367, 486.1, 487.1; 428/95.1, 328, 336, 472, 551, 698, 702; 438/149, 257, 396, 589, 623, 768
See application file for complete search history.

(56) References Cited

U.S. PATENT DOCUMENTS

| | | | |
|---|---|---|---|
| 7,081,142 B1 * | 7/2006 | Carlson | H01M 4/602 |
| | | | 429/231.9 |
| 9,209,513 B2 | 12/2015 | Ely et al. | |
| 10,619,248 B2 * | 4/2020 | Tsukamoto | C23C 18/31 |
| 2004/0185683 A1 | 9/2004 | Nakamura | |
| 2006/0055021 A1 | 3/2006 | Yamamoto | |
| 2016/0186354 A1 | 6/2016 | Hiraoka et al. | |
| 2019/0237599 A1 | 8/2019 | Glatthaar et al. | |
| 2021/0204409 A1 * | 7/2021 | Kondoh | H05K 3/242 |
| 2022/0007506 A1 * | 1/2022 | Kuroda | C25D 7/123 |
| 2022/0061165 A1 * | 2/2022 | Kuroda | H05K 3/246 |

FOREIGN PATENT DOCUMENTS

| | | |
|---|---|---|
| JP | 2006086194 A | 3/2006 |
| JP | 2010027801 A | 2/2010 |
| JP | 2016125087 A | 7/2016 |
| JP | 2016225524 A | 12/2016 |
| JP | 2017101300 A | 6/2017 |
| KR | 20040082987 A | 9/2004 |
| KR | 101272664 B1 | 6/2013 |
| KR | 20160079709 A | 7/2016 |
| WO | WO0241676 A1 | 5/2002 |

* cited by examiner

| | Ex. 1 | Ex. 2 | Ex. 3 | Ex. 4 | Comp. Ex. 1 |
|---|---|---|---|---|---|
| Underlayer | WSi$_2$ | ZrSi$_2$ | ITO | Ti | WC |
| Appearance after film deposition |  About 7mm |  |  |  |  |
| Rising potential difference from Ag [V] | 0.25 | 0.25 | 0.18 | 0.02 | 0 |
| Deposition selectivity | ○ | ○ | ○ | ○ | × |

| Underlayer [nm] | | Seed layer [nm] | | | |
|---|---|---|---|---|---|
| | | 10 | 20 | 100 | 300 |
| | 10 | - | - | Ex. 11  | - |
| | 20 | - | - | Ex. 9  | - |
| | 100 | Ex. 10  | Ex. 7  | Ex. 1  | Ex. 6  |
| | 300 | - | - | Ex. 8  | - |

METHOD FOR MANUFACTURING WIRING BOARD, AND WIRING BOARD

CROSS REFERENCE TO RELATED APPLICATIONS

The present application claims priority from Japanese patent application JP 2019-168980 filed on Sep. 18, 2019, the entire content of which is hereby incorporated by reference into this application.

BACKGROUND

Technical Field

The present disclosure relates to methods for manufacturing a wiring board to form a wiring layer on the surface of a substrate, and wiring boards.

Description of Related Art

Conventionally known methods of manufacturing a wiring board includes a subtractive method, a semi-additive method, and a full-additive method. Among these manufacturing methods, a semi-additive method is mainly used for a high-density wiring board.

JP 2016-225524 A, for example, discloses the method for manufacturing a wiring board by a semi-additive method. The method of JP 2016-225524 A stacks a dielectric layer, a seed layer, and a first plating layer in this order on the surface of a base layer (substrate), and forms a resist pattern of resin having a predetermined shape on the surface of the first plating layer. Then, the method forms a second plating layer on an exposed portion of the first plating layer without the resist pattern, and removes the resist pattern. After that, the method removes the first plating layer and the seed layer using the second plating layer as the mask to form a conductive pattern including the seed layer, the first plating layer and the second plating layer.

SUMMARY

The method of manufacturing a wiring board described in JP 2016-225524 A has to form the resist pattern of resin having a predetermined thickness on the surface of the first plating layer to form the second plating layer. When there is no need of the resist pattern during the manufacturing of the wiring board, the resist pattern has to be removed. In this way this method has the problems that a lot of steps is required to form and remove the resist pattern and a lot of liquid waste is generated.

In JP 2016-225524 A, the second plating layer is formed only on the surface (upper face) of the first plating layer. The contact area between the second plating layer and the first plating layer therefore is small especially for minute wiring, and improved adhesion between the second plating layer and the first plating layer is required.

In view of this, the present disclosure provides a method for manufacturing a wiring board capable of forming a wiring layer having favorable adhesion and without a resin resist pattern, and such a wiring board.

A method for manufacturing a wiring board according to the present disclosure manufactures a wiring board including an insulating substrate, and a wiring layer with a predetermined wiring pattern disposed on the surface of the insulating substrate, and the method includes: preparing a substrate with seed-layer, the substrate with seed-layer including: an electrically conductive underlayer on the surface of the insulating substrate; and a seed layer with a predetermined pattern corresponding to the wiring pattern on the surface of the underlayer, the seed layer containing metal; disposing a solid electrolyte membrane between an anode and the seed layer as a cathode, pressing the solid electrolyte membrane against the seed layer and the underlayer, and applying voltage between the anode and the underlayer to reduce metal ions contained in the solid electrolyte membrane and so form a metal layer on the surface of the seed layer; and removing an exposed region of the underlayer without the seed layer and the metal layer to form the wiring layer including the underlayer, the seed layer and the metal layer on the surface of the insulating substrate, and so manufacture the wiring board. During formation of the metal layer on the surface of the seed layer, at least a region of the surface of the underlayer, on which the seed layer is not formed, contains oxide.

The method for manufacturing a wiring board of the present disclosure forms a metal layer on a substrate with seed-layer including: an underlayer on the surface of the insulating substrate; and a seed layer on the surface of the underlayer. To this end, the method presses the solid electrolyte membrane against the seed layer and the underlayer, and applies voltage between the anode and the underlayer to reduce metal ions contained in the solid electrolyte membrane and so form a metal layer on the surface of the seed layer. The surface of the underlayer contains oxide, and such a surface of the underlayer therefore presumably has higher activation energy for the reduction reaction of the metal ions than the surface (laminated surface) and the side faces of the seed layer. The solid electrolyte membrane is pressed against the seed layer and the underlayer, so that the solid electrolyte membrane comes into close contact with the underlayer as well as the seed layer. Nevertheless the method can selectively form the metal layer only on the surface of the seed layer. The method therefore forms the metal layer on the surface of the seed layer without using a resin resist pattern. The exposed region of the underlayer without the seed layer and the metal layer is then removed, and this forms the wiring layer having a predetermined wiring pattern on the surface of the insulating substrate. As stated above, the method forms the metal layer on the surface of the seed layer without using a resin resist pattern, and so the method does not need the formation and removal of a resist pattern. As a result, the method does not require a lot of steps to manufacture the wiring board and does not generate a large amount of liquid waste.

The method applies voltage between the anode and the underlayer while pressing the solid electrolyte membrane against the seed layer and the underlayer, and so forms the metal layer while deforming the solid electrolyte membrane so as to follow the shapes of the seed layer and the underlayer. As a result, the metal layer is formed on the surface of the seed layer as well as the side faces of the seed layer, so that the metal layer is formed to cover the laminated face that is the surface of the seed layer and the side faces of the seed layer. This improves the adhesion between the metal layer and the seed layer as compared with the case of the formation of the metal layer only on the surface of the seed layer.

In some embodiments of the method for manufacturing the wiring board as stated above, during formation of the metal layer on the surface of the seed layer, a natural oxide film including the oxide is formed in at least a region of the surface of the underlayer, on which the seed layer is not formed. This configuration facilitates the formation of the underlayer so that the underlayer contains oxide at the surface. The natural oxide film refers to an oxide film that is naturally formed on the surface of a substance when the substance is left in the atmosphere. In one example, the natural oxide film includes a passive film formed on the surface of Al, Cr, Ti and its alloys, and $SiO_2$ formed on the surface of $ZrSi_2$ and $WSi_2$.

In some embodiments of the method for manufacturing the wiring board as stated above, when copper sulfate solution with concentration of 1 mol/L at a temperature of 25° C. is used as an electrolyte, oxygen-free copper wire is used as a counter electrode, a saturated calomel electrode is used as a reference electrode, and a first polarization curve using the material of the underlayer as a working electrode and a second polarization curve using the metal of the seed layer as a working electrode are measured while setting the potential sweep rate at 10 mV/sec, potential of the first polarization curve at a current density of 0.1 $mA/cm^2$ is higher than potential of the second polarization curve at a current density of 0.1 $mA/cm^2$ by 0.02 V or more. This configuration enables a sufficiently large difference (about 0.02 V or more) in rising potential of the polarization curve between the material of the underlayer and the material of the seed layer, and so allows selective formation of the metal layer only on the surface of the seed layer of the seed layer and the underlayer that are in close contact with the solid electrolyte membrane during formation of the metal layer on the surface of the seed layer.

In some embodiments of the method for manufacturing the wiring board as stated above, when preparing the substrate with seed-layer, the method prepares a substrate including a surface with center-line average roughness Ra of 1 μm or less as the insulating substrate, and forms the underlayer by sputtering on the surface of the insulating substrate. Typically the contact area between the substrate and the underlayer decreases with the center-line average roughness Ra of the substrate, and so the adhesion decreases accordingly. Conventional methods of manufacturing a wiring board therefore roughens the surface of the substrate to obtain the adhesion between the substrate and the underlayer from the anchor effect. As stated above the method of the present disclosure forms the underlayer on the surface of the insulating substrate by sputtering to firmly bond the substrate and the underlayer due to covalent bond. That is, even when the substrate has the center-line average roughness Ra of 1 μm or less, the method sufficiently keeps the adhesion between the substrate and the underlayer. The method therefore does not need roughening of the surface of the substrate to keep the adhesion between the substrate and the underlayer.

In some embodiments, the seed layer is formed on the surface of the underlayer so that line/space is 2 μm or more and 100 μm or less/2 μm or more and 100 μm or less. Such center-line average roughness Ra of the insulating substrate of 1 μm or less decreases the center-line average roughness Ra of the underlayer as well. When ink is disposed on the surface of the underlayer, such an underlayer suppresses the deformation of the ink due to the surface shape (surface irregularities) of the underlayer. This leads to easy formation of the seed layer having a fine line/space of 2 μm or more and 100 μm or less/2 μm or more and 100 μm or less. Such a fine seed layer means very small contact area between the metal layer and the seed layer if the metal layer is formed only on the surface of the seed layer, and this degrades the adhesion between the metal layer and the seed layer. In this respect, the method for manufacturing the wiring board of the present disclosure forms the metal layer so as to cover the surface and the side faces of the seed layer as described above. This improves the adhesion between the metal layer and the seed layer. In this way, the fine seed layer also easily keeps the adhesion between the metal layer and the seed layer.

In some embodiments of the method for manufacturing the wiring board as stated above, when preparing the substrate with seed-layer, the method places ink containing metal nanoparticles on the surface of the underlayer, and then sinters the metal nanoparticles to form the seed layer. Such ink containing metallic nanoparticles enables easy formation of the seed layer having a fine pattern.

In some embodiments of the method for manufacturing the wiring board as stated above, when preparing the substrate with seed-layer, the method forms the seed layer on the surface of the underlayer so that the predetermined pattern of the seed layer has a plurality of independent patterns that are spaced away from each other. Even in the configuration of the seed layer having a plurality of independent patterns spaced away from each other, these independent patterns are electrically connected to each other through the underlayer, and the metal layer is therefore formed also on the independent patterns of the seed layer when voltage is applied between the anode and the underlayer. That is, while conventional methods require the formation of a lead to apply voltage to each of the plurality of independent patterns disposed apart from each other, this manufacturing method does not require a lead to apply voltage to each of the independent patterns, because the independent patterns are electrically connected to each other through the underlayer. In this way there is no need for a space for forming the lead, and so the method easily forms a higher density wiring pattern.

A wiring board according to the present disclosure includes an insulating substrate, and a wiring layer with a predetermined wiring pattern disposed on the surface of the insulating substrate. The wiring layer includes the lamination of: an electrically conductive underlayer disposed on the surface of the insulating substrate; a seed layer disposed on the surface of the underlayer and containing metal; and a metal layer disposed on the surface of the seed layer. The seed layer includes a side face extending from a laminated surface that is the surface of the seed layer toward the underlayer. The metal layer covers the surface and the side face of the seed layer. At least a region of the surface of the underlayer, on which the seed layer is not formed, contains oxide.

According to the wiring board of the present disclosure, the metal layer covers the surface and the side face of the seed layer. This improves the adhesion between the metal layer and the seed layer as compared with the case of the formation of the metal layer only on the surface of the seed layer.

The wiring board of the present disclosure can be manufactured by the method for manufacturing a wiring board as stated above.

In some embodiments of the wiring board as stated above, the metal layer on the surface of the seed layer has a thickness that is larger than a thickness of the metal layer on the side face. This configuration keeps the thickness of the wiring layer without narrowing the wiring interval of the wiring layer, and so easily keeps the insulation reliability between the wirings.

In some embodiments of the wiring board as stated above, the wiring layer is formed in a taper shape that tapers in accordance with a distance from the insulating substrate in a portion closer to the insulating substrate than the surface of the seed layer, and is formed in a reverse taper shape that becomes thicker in accordance with a distance from the insulating substrate in a portion farther from the insulating substrate than the surface of the seed layer. The wiring layer has a width of the taper-shaped part that is smaller than a width of the reverse taper-shaped part. This configuration keeps the wiring width with the reverse taper-shaped part, and widens the wiring interval (wiring interval in the vicinity of the surface of the insulating substrate) between the taper-shaped parts. The wiring board therefore keeps insulation reliability between the wirings.

In some embodiments of the wiring board as stated above, the seed layer has line/space of 2 μm or more and 100 μm or less/2 μm or more and 100 μm or less. Such a fine seed layer means very small contact area between the metal layer and the seed layer if the metal layer is formed only on the surface of the seed layer, and this degrades the adhesion between the metal layer and the seed layer. In this respect, the wiring board of the present disclosure includes the metal layer disposed to cover the surface and the side face of the seed layer as described above. This configuration improves the adhesion between the metal layer and the seed layer, and so easily keeps the adhesion between the metal layer and the fine seed layer.

Effect

The present disclosure provides a wiring board having a wiring layer with favorable adhesion that is formed without a resin resist pattern.

DETAILED DESCRIPTION OF THE EMBODIMENTS

The following describes a wiring board and a method for manufacturing the wiring board according to embodiments of the present disclosure.

Figure 1:
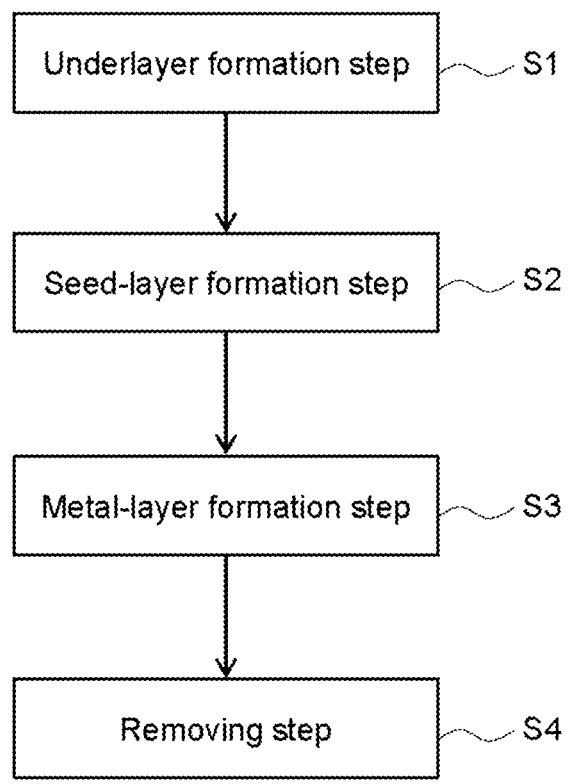
FIG. 1 is a flowchart of the method for manufacturing a wiring board according to one embodiment of the present disclosure.

Firstly the following describes a method for manufacturing a wiring board 1 according to one embodiment of the present disclosure. FIG. 1 is a flowchart of the method for manufacturing the wiring board 1 according to one embodiment of the present disclosure. As shown in FIG. 1, the method for manufacturing the wiring board 1 includes an underlayer formation step S1, a seed-layer formation step S2, a metal-layer formation step S3 and a removal step S4. The following describes an example of the method for manufacturing the wiring board 1 of the present disclosure that includes the underlayer formation step S1 and the seed-layer formation step S2. In another example, the method for manufacturing the wiring board 1 of the present disclosure does not include the underlayer formation step S1 and the seed-layer formation step S2, and may include a step of preparing a substrate with seed-layer 9 having an underlayer 4 on the surface of an insulating substrate 2 and a seed layer 5 on the surface of the underlayer 4. The method for manufacturing the wiring board 1 of the present disclosure does not include the underlayer formation step S1, and may include a step of preparing a substrate with underlayer having an underlayer 4 on the surface of a substrate 2 and a seed-layer formation step S2. In any case, the method can prepare the substrate with seed-layer 9 including the substrate 2, the underlayer 4 and the seed layer 5.

Figure 2:
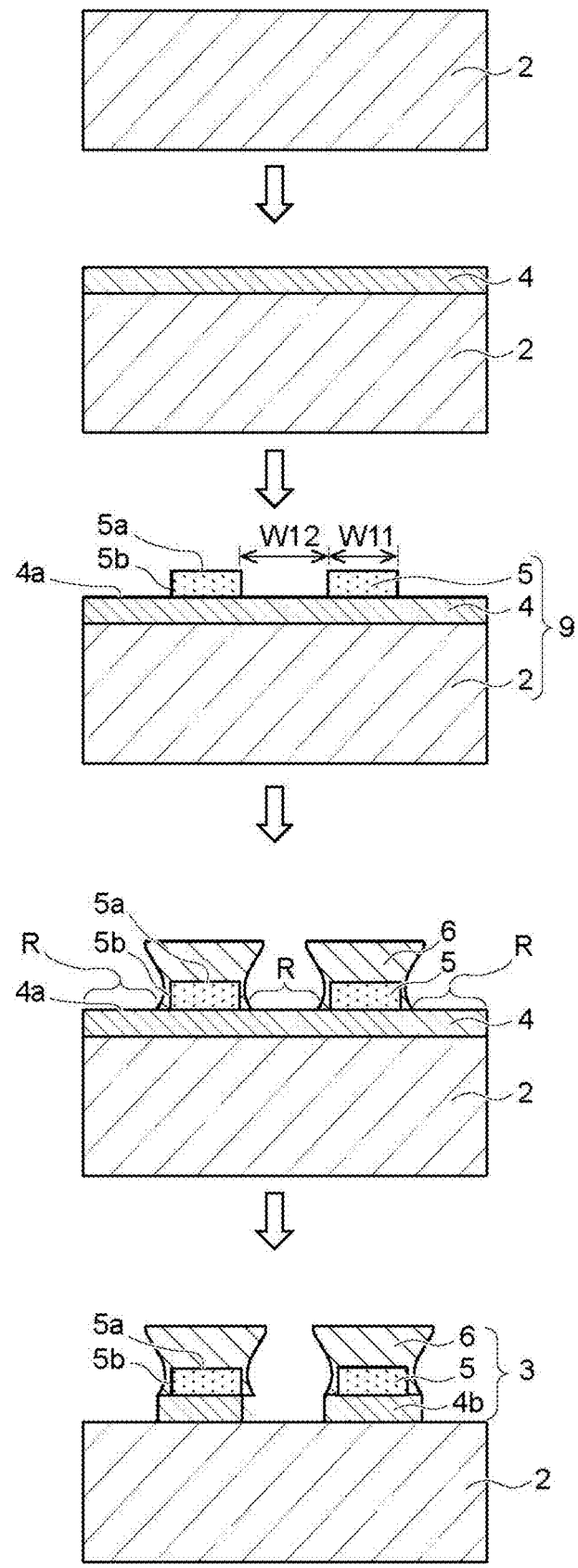
FIG. 2 schematically shows the method for manufacturing a wiring board according to one embodiment of the present disclosure.

As shown in FIG. 2, the underlayer formation step S1 forms the underlayer 4 having electrical conductivity on the surface of the prepared insulating substrate 2. The underlayer 4 is formed on the entire surface of the substrate 2 without using a mask.

The substrate 2 is not particularly limited, and in some embodiments, the substrate 2 is made of a glass epoxy resin, is a flexible film-like substrate made of polyimide resin, for example, or is a substrate made of glass. Particularly in some embodiments, a substrate made of glass epoxy resin is used. When the substrate 2 is made of resin, examples of the resin include thermoplastic resin, such as ABS resin, AS resin, AAS resin, PS resin, EVA resin, PMMA resin, PBT resin, PET resin, PPS resin, PA resin, POM resin, PC resin, PP resin, PE resin, polymer alloy resin containing elastomer and PP, modified PPO resin, PTFE resin, or ETFE resin, thermosetting resin, such as phenol resin, melamine resin, amino resin, unsaturated polyester resin, polyurethane, diallylphthalate, silicone resin or alkyd resin, resin obtained by adding cyanate resin to, for example, epoxy resin, and liquid crystal polymer.

In some embodiments, the surface of the substrate 2 (upper face in FIG. 2) is a flat face. The center-line average roughness Ra of the surface of the substrate 2 is not particularly limited, and is 1 μm or less in some embodiments. Such center-line average roughness Ra of the substrate 2 of 1 μm or less decreases the center-line average roughness Ra of the underlayer 4 as well. When ink is disposed on the surface of the underlayer 4 as described later, this suppresses the deformation of the ink due to the surface shape (surface irregularities) of the underlayer 4. This configuration leads to easy formation of the seed layer 5 having a fine line/space of 2 μm or more and 100 μm or less/2 µm or more and 100 µm or less, for example, as described later. In the present specification and claims, the center-line average roughness Ra is a value measured according to JIS B0601-1994.

The underlayer 4 has oxide on the surface. Examples of the layer having oxide on the surface include a layer on the surface of which a natural oxide film is formed, and a layer containing oxide in the entire layer. In some embodiments, the underlayer 4 is a layer on the surface of which a natural oxide film is formed. The natural oxide film refers to an oxide film that is naturally formed on the surface of a substance when the substance is left in the atmosphere. The natural oxide film includes a passive film formed on the surface of Al, Cr, Ti and its alloys, and $SiO_2$ formed on the surface of $ZrSi_2$ and $WSi_2$.

When the underlayer 4 is a layer on the surface of which a natural oxide film is formed, such an underlayer 4 may be made of silicide in some embodiments. Silicide refers to a compound composed of metal and silicon. When the underlayer 4 is made of silicide, the silicide is transition metal silicide in some embodiments. Transition metal silicide refers to silicide composed of transition metal and silicon. When the underlayer 4 is made of transition metal silicide, example of the transition metal silicide includes $FeSi_2$, $CoSi_2$, $MoSi_2$, $WSi_2$, $VSi_2$, $ReSi_{1.75}$, $CrSi_2$, $NbSi_2$, $TaSi_2$, $TiSi_2$ or $ZrSi_2$ in some embodiments, and $ZrSi_2$ or $WSi_2$ in some embodiments.

The material of the underlayer 4 is not particularly limited, and examples of the material include transition metal silicide, such as $ZrSi_2$ or $WSi_2$, metal oxide, such as ITO (indium tin oxide), Ti, alloys containing Ti, alloys containing Cr, such as stainless steel, and conductive resin in some embodiments. Particularly the underlayer 4 is made of transition metal silicide, such as $ZrSi_2$ or $WSi_2$ in some embodiments. The thickness of the underlayer 4 is not particularly limited, and is 20 nm or more and 300 nm or less in some embodiments. The thickness of the underlayer 4 less than 20 nm may cause unevenness in part of the metal layer 6 at the metal-layer formation step S3 described later. The thickness of the underlayer 4 more than 300 nm favorably forms the metal layer 6 at the metal-layer formation step S3 described later, but the material cost and the process cost required for forming and removing the underlayer 4 will increase, and so the cost effectiveness deteriorates.

In one example, the underlayer 4 may be formed by sputtering. This forms covalent bonding of the underlayer 4 and the substrate 2 and so allows tight bonding of the underlayer 4 with the substrate 2. Even when the substrate 2 has the center-line average roughness Ra of 1 µm or less, such an underlayer 4 suppresses peeling off of the underlayer 4 from the substrate 2. That is, even when the substrate 2 has the center-line average roughness Ra of 1 µm or less, such an underlayer 4 keeps sufficient adhesion between the substrate 2 and the underlayer 4. When the substrate 2 is made of glass epoxy resin and the underlayer 4 is made of transition metal silicide, such as $WSi_2$ or $ZrSi_2$, this easily increases the adhesion between the underlayer 4 and the substrate 2. The method for forming the underlayer 4 is not particularly limited, and another method, such as deposition including PVD (physical vapor deposition) and CVD (chemical vapor deposition), or plating, may be used instead of the sputtering. Such tight bonding of the underlayer 4 and the substrate 2 due to covalent bonding eliminates the necessity of roughening of the surface of the substrate 2 to keep the adhesion between the underlayer 4 and the substrate 2. Typically the contact area between the substrate 2 and the underlayer 4 decreases with the center-line average roughness Ra of the substrate 2, and the adhesion decreases accordingly. Conventional wiring boards therefore require roughening of the surface of the substrate.

The seed-layer formation step S2 forms the seed layer 5 having a predetermined pattern and containing metal on the surface of the underlayer 4. This forms the substrate with seed-layer 9 including the substrate 2, the underlayer 4 and the seed layer 5.

It is undesirable that the seed layer 5 is made of the same material as that of the underlayer 4, because the metal layer 6 cannot be selectively formed on the surface of the seed layer 5 as described later. In some embodiments, the seed layer 5 is a layer on the surface of which a natural oxide film is not formed or a layer which does not contain oxide in the entire layer. If a natural oxide film is formed on the surface of the seed layer 5, the seed layer 5 has a smaller thickness of the natural oxide film than the natural oxide film of the underlayer 4 in some embodiments. Specifically, examples of the material of the seed layer 5 include silver, copper, gold, palladium, and platinum, and particularly the seed layer 5 is made of silver or copper in some embodiments. The material of the seed layer 5 may be two or more types selected from the group consisting of silver, copper, gold, palladium and platinum.

The thickness of the seed layer 5 is not particularly limited, and the thickness is 20 nm or more and 300 nm or less in some embodiments. The thickness of the seed layer 5 less than 20 nm may cause unevenness in part of the metal layer 6 at the metal-layer formation step S3 described later. The thickness of the seed layer 5 more than 300 nm favorably forms the metal layer 6 at the metal-layer formation step S3 described later, but the material cost and the process cost required for forming the seed layer 5 will increase, and so the cost effectiveness deteriorates. The line/space of the seed layer 5 is not particularly limited, and is 2 µm or more and 100 µm or less/2 µm or more and 100 µm or less, for example. That is, in one example, the line (line width) W11 of the seed layer 5 is 2 µm or more and 100 µm or less, and the space (line space) W12 in the seed layer 5 is 2 µm or more and 100 µm or less. The line/space is the line width W11/fine space W12 in a plan view of the wiring board 1. The line (line width) W11 and the space (line space) W12 of the seed layer 5 may be the same dimension or may be different dimensions.

Such a fine seed layer 5 means very small contact area between the metal layer 6 and the seed layer 5 if the metal layer 6 is formed only on the surface (laminated face) 5a of the seed layer 5. This degrades the adhesion between the metal layer 6 and the seed layer 5. The wiring board 1 of the present disclosure includes the metal layer 6 disposed to cover the surface 5a and the side face 5b of the seed layer 5 as described later. This improves the adhesion between the metal layer 6 and the seed layer 5, and so easily keeps the adhesion between the metal layer 6 and the fine seed layer 5.

Figure 3:
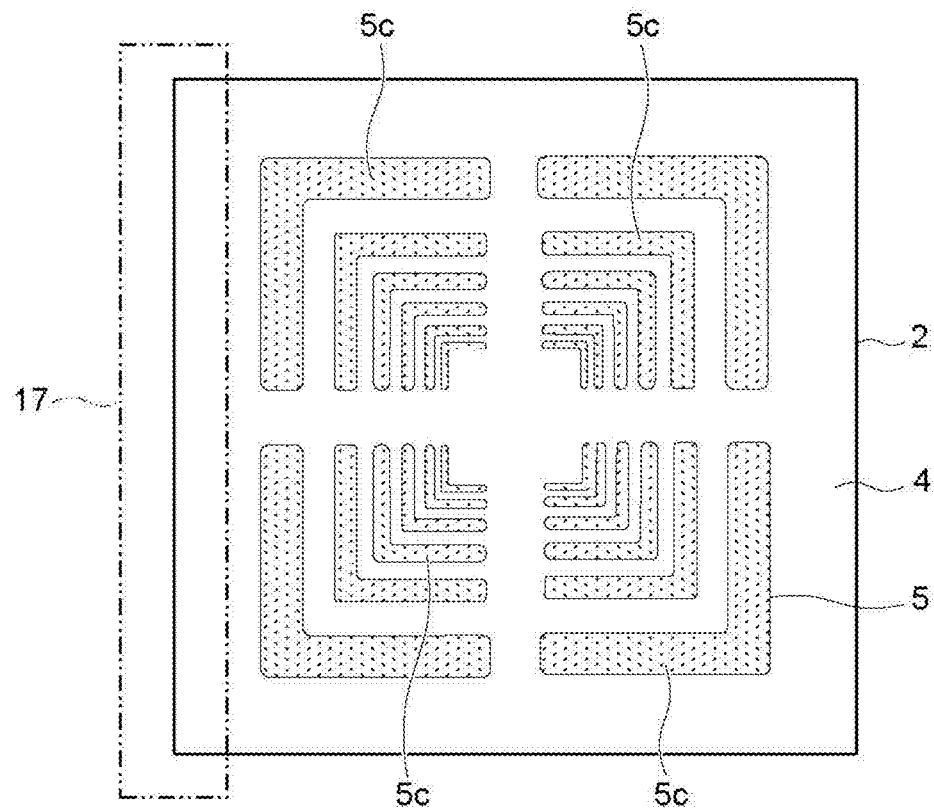
FIG. 3 is a plan view of a seed layer formed to have independent patterns on the surface of the underlayer of the wiring board that is one embodiment of the present disclosure.

As shown in FIG. 3, the seed layer 5 is formed to have a plurality of independent patterns 5c that are disposed apart from each other. In FIG. 3, the plurality of independent patterns 5c are hatched. The plurality of independent patterns 5c is electrically connected to each other through the underlayer 4, and the metal layer 6 is therefore formed also on the independent patterns 5c of the seed layer 5 at the metal-layer formation step S3 described later. That is, while conventional methods require the formation of a lead to apply voltage to each of the plurality of independent patterns disposed apart from each other, the manufacturing method of the present embodiment does not require the formation of a lead to apply voltage to each of the independent patterns 5c, because the independent patterns 5c are electrically connected to each other through the underlayer 4. In this way there is no need for a space for forming the lead, and so the method easily forms a higher density wiring pattern.

In one example, the seed-layer formation step S2 disposes ink containing metal particles on the surface of the underlayer 4 and solidifies the ink to form the seed layer 5 having a predetermined pattern. The method for disposing the ink on the surface of the underlayer 4 is not limited especially, and various print methods, such as screen printing, inkjet printing, and transfer printing, may be used. In one example, the seed layer 5 may be formed without using ink and by evaporation or sputtering. The method for solidifying the disposed ink on the surface of the underlayer 4 is not limited especially, and various methods may be used, such as sintering of metal particles in the ink or solidifying the ink by heating or drying. When the seed layer 5 is formed by sintering, the sintering is performed at the heatproof temperature of the substrate 2 or lower (for example, about 250° C. or lower when the substrate 2 is made of glass epoxy resin).

The material of the metal particles in the ink is not especially limited, and examples of the material include silver, copper, gold, palladium, and platinum in some embodiments. Particularly the metal particles are made of silver or copper in some embodiments. The material of the metal particles may be two or more types selected from the group consisting of silver, copper, gold, palladium and platinum. The particle diameter of the metal particles is not particularly limited, and the particle diameter is smaller in some embodiments to form the wiring in the μm order. In one example, the particle diameter is in the nm order that is 1 nm or more and 100 nm or less. Such metal particles are also called metal nanoparticles. In one example, the metal nanoparticles having a particle diameter of 20 nm or less may be used, and this lowers the melting point of the metal particles and so enables easy sintering. Ink containing metallic nanoparticles enables easy formation of the seed layer 5 having a fine pattern.

The dispersion medium and additives contained in the ink are not particularly limited, and they have a property of volatilizing during sintering in some embodiments. In one example, decanol can be used as the dispersion medium, and a linear fatty acid salt having about 10 to 17 carbon atoms can be used as the additive.

In cross-sectional view, the seed layer 5 has the surface (upper surface in FIG. 2) 5a on the side opposite to the substrate 2 side and the side faces 5b extending from both ends of surface 5a toward the substrate 2. In cross-sectional view, the seed layer 5 has a taper shape that tapers in accordance with a distance from the substrate 2 or has a rectangular shape.

In the present embodiment, before the metal-layer formation step S3, the surface 4a of the underlayer 4 contains oxide. The oxide is not particularly limited. The oxide may be a natural oxide film that is formed on the surface of silicide, such as $ZrSi_2$ or $WSi_2$, or on the surface of metal, such as Ti or stainless steel. The oxide may be an oxide film separately disposed on the surface of silicide, metal or the like as long as the seed layer 5 can be selectively energized. Oxide including a natural oxide film enables easy formation of the underlayer 4, the surface 4a of which contains oxide. In one example, when the underlayer 4 includes silicide, such as $ZrSi_2$ or $WSi_2$, a natural oxide film including $SiO_2$ is formed on the surface of the silicide. When the oxide includes a natural oxide film, such a natural oxide film is formed on the entire surface 4a of the underlayer 4. When the oxide includes a separately disposed oxide film, such an oxide film is formed on the area in the surface 4a of the underlayer 4 without the seed layer 5 after the seed-layer formation step S2. In any case, at least the area in the surface 4a of the underlayer 4 without the seed layer 5 contains oxide.

The metal-layer formation step S3 forms the metal layer 6 on the surface 5a of the seed layer 5. The material of the metal layer 6 is not especially limited, and examples of the material include copper, nickel, silver and gold in some embodiments. Particularly the metal layer 6 is made of copper in some embodiments. The thickness of the metal layer 6 is not particularly limited, and the thickness is 1 μm or more and 100 μm or less in some embodiments.

The following describes the structure of a film-deposition apparatus 100 (see FIG. 4) used for forming the metal layer 6 at the metal-layer formation step S3. This film-deposition apparatus 100 is a film-deposition apparatus (plating apparatus) used to deposit metallic coating (the metal layer 6 in the present embodiment) by solid electrodeposition, and forms the metal layer 6 on the surface 5a of the seed layer 5.

Figure 4:
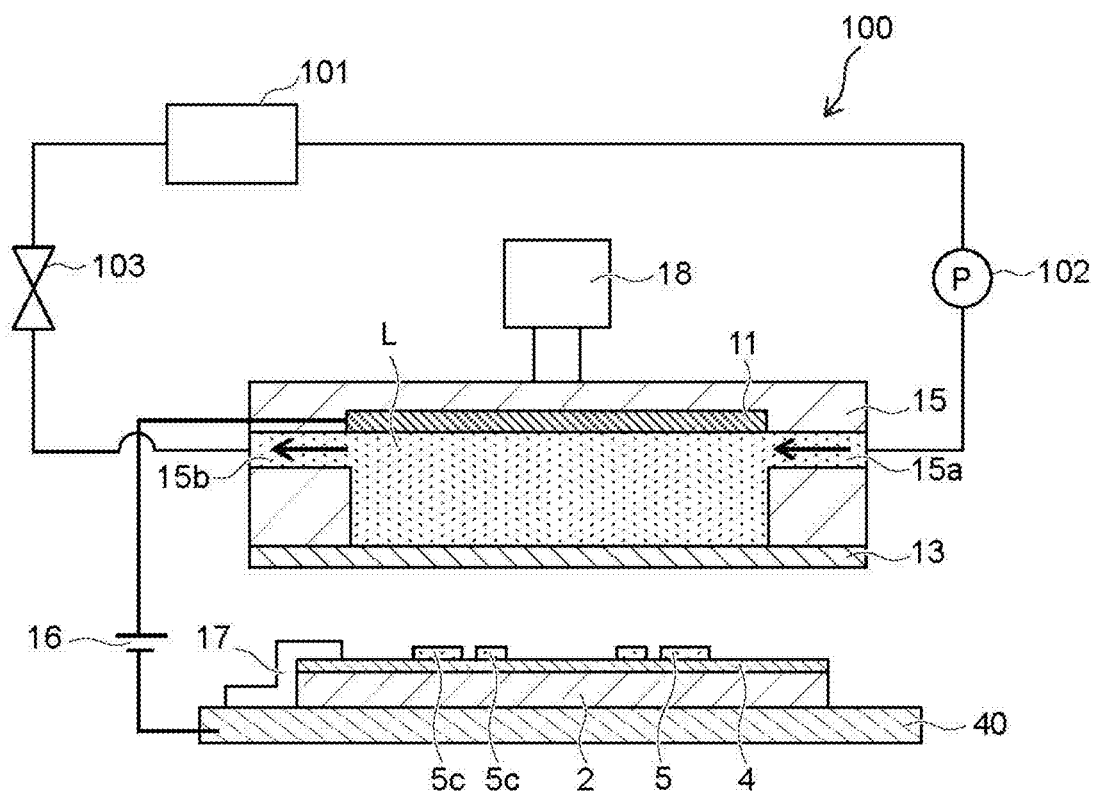
FIG. 4 is a cross-sectional view showing the structure of a film-deposition apparatus that is used to manufacture a wiring board according to one embodiment of the present disclosure.

As shown in FIG. 4, the film-deposition apparatus 100 includes a metal anode 11, a solid electrolyte membrane 13 disposed between the anode 11 and a seed layer 5 that is a cathode, and a power supply 16 to apply voltage between the anode 11 and the underlayer 4. The underlayer 4 and the seed layer 5 are electrically connected, and therefore electric current flows between the anode 11 and the seed layer 5 during film deposition by applying voltage between the anode 11 and the underlayer 4 from the power supply 16.

In the present embodiment, the film-deposition apparatus 100 further includes a housing 15. The housing 15 stores the anode 11 and solution L (hereinafter referred to as metallic solution L) containing metal ions, such as copper, nickel, silver or gold, that is the material of the metallic coating (the metal layer 6 in this case) to be formed. More specifically, a space for containing the metallic solution L is defined between the anode 11 and the solid electrolyte membrane 13, and the metallic solution L stored in the space flows from one side to the other side.

The anode 11 has a plate shape, and may be either a soluble anode made of the same material (e.g., copper) as the metallic coating (the metal layer 6 in this case) or an anode made of a material (e.g., titanium) that is insoluble in the metallic solution L. In the present embodiment, the anode 11 and the solid electrolyte membrane 13 are disposed away from each other. In another embodiment, the anode 11 and the solid electrolyte membrane 13 may come in contact with each other, and the anode 11 may include a porous body that transmits the metallic solution L and supplies metal ions to the solid electrolyte membrane 13. In this case, when the anode 11 is pressed against the solid electrolyte membrane 13, uneven deposition may occur due to a variation in the pressing force of the anode 11 against the solid electrolyte membrane 13. Such a configuration of pressing the anode 11 against the solid electrolyte membrane 13 is therefore not favorable to manufacturing fine wiring. However, when the wiring is not fine, the adverse effect from uneven deposition is small, and therefore the housing 15 may have the structure of pressing the anode 11 against the solid electrolyte membrane 13.

The solid electrolyte membrane 13 is not particularly limited, as long as when the solid electrolyte membrane 13 comes in contact with the metallic solution L as stated above, the solid electrolyte membrane 13 can be impregnated with (contain) metal ions, and when voltage is applied, the metal originating from the metal ions can be deposited on the surface of the cathode (seed layer 5). In one example, the thickness of the solid electrolyte membrane 13 is about 5 μm to about 200 μm. Examples of the material of the solid electrolyte membrane 13 include resin having a cation exchange function, including fluorine-based resin, such as Nafion (registered trademark) manufactured by DuPont, hydrocarbon resin, polyamic acid resin, and Selemion (CMV, CMD, CMF series) manufactured by Asahi Glass Co.

As stated above, the metallic solution L is liquid containing the metal of the metallic coating to be formed in an ionic state, and examples of the metal include copper, nickel, silver and gold. The metallic solution L is a solution (ionization) of these metals with an acid, such as nitric acid, phosphoric acid, succinic acid, nickel sulfate, or pyrophosphoric acid.

The film-deposition apparatus 100 further includes an elevator 18 above the housing 15 to move the housing 15 up and down. The elevator 18 is not particularly limited as long as it can move the housing 15 up and down. In one example, the elevator 18 may include a hydraulic or pneumatic cylinder, an electric actuator, a linear guide, and a motor. The housing 15 has an inlet 15a for receiving the supplied metallic solution L and an outlet 15b for discharging the metallic solution L. These inlet 15a and outlet 15b connect to a tank 101 via a pipe. The metallic solution L sent from the tank 101 by the pump 102 flows into the housing 15 through the inlet 15a, is discharged from the outlet 15b, and returns to the tank 101. The film-deposition apparatus 100 includes a pressure regulation valve 103 downstream of the outlet 15b, and the pressure regulation valve 103 and the pump 102 pressurize the metallic solution L in the housing 15 with a predetermined pressure. With this configuration, the solid electrolyte membrane 13 presses the seed layer 5 due to the liquid pressure of the metallic solution L during film deposition. As a result, the metallic coating (the metal layer 6) can be formed on the seed layer 5 while uniformly pressing the seed layer 5 with the solid electrolyte membrane 13.

The film-deposition apparatus 100 of this embodiment includes a metallic mount 40 to mount the substrate 2. The metallic mount 40 electrically connects (is conductive) to the negative electrode of the power supply 16. The positive electrode of the power supply 16 electrically connects (is conductive) to the anode 11 that is built in the housing 15.

Specifically, the film-deposition apparatus 100 includes a conductive member 17 that comes in contact with a part of the underlayer 4 or the seed layer 5 (specifically with their ends) during film deposition of the metallic coating so as to establish electric continuity between the negative electrode of the power supply 16 and the underlayer 4 or the seed layer 5. The conductive member 17 can be attached to the substrate 2 so as to come into contact with a part of the underlayer 4 during film deposition, and can be detached from the substrate 2. The conductive member 17 is a metal plate that covers a part of the edge of the substrate 2, and a part of the conductive member 17 is bent so as to be in contact with the metallic mount 40. This allows the metallic mount 40 to be conductive to the underlayer 4 via the conductive member 17. The conductive member 17 may be formed to come into contact with a part of the seed layer 5. In this case also, the part of the seed layer 5 that is in contact with the conductive member 17 is conductive to the other part of the seed layer 5 via the underlayer 4.

Figure 5:
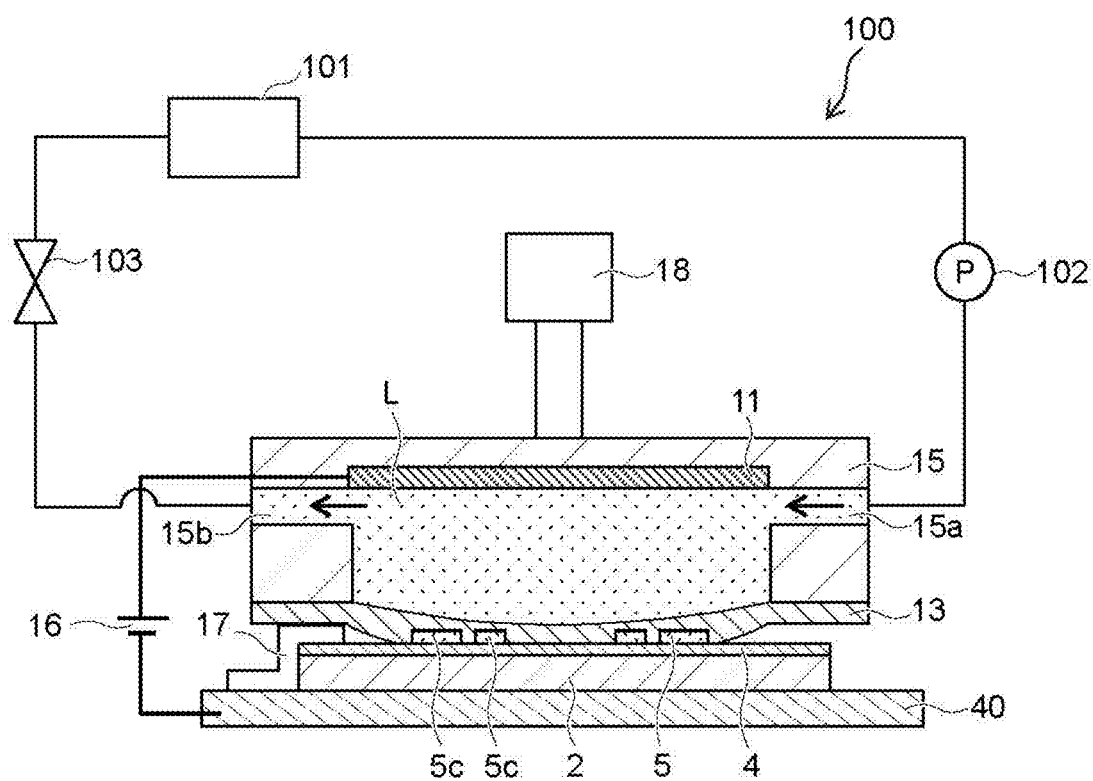
FIG. 5 is a cross-sectional view of the film-deposition apparatus when the housing is lowered to a predetermined height from the state of FIG. 4.
Figure 6:
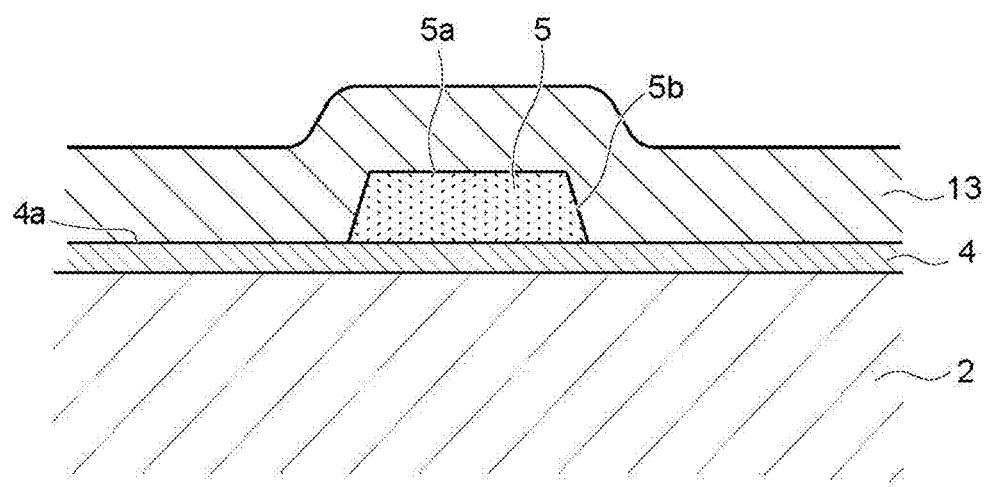
FIG. 6 is a cross-sectional view showing a solid electrolyte membrane that is in close contact with the side faces of the seed layer.

As shown in FIG. 4, the metal-layer formation step S3 places the substrate 2 and the conductive member 17 at predetermined positions on the metallic mount 40. Then, as shown in FIG. 5, the elevator 18 lowers the housing 15 to a predetermined height. When the metallic solution L is pressurized by the pump 102, the solid electrolyte membrane 13 is deformed to follow the shapes of the seed layer 5 and the underlayer 4 as shown in FIG. 6, and the metallic solution L in the housing 15 has a set constant pressure by the pressure regulation valve 103. That is, the solid electrolyte membrane 13 is able to uniformly press the surface 5a and the side faces 5b of the seed layer 5 and the surface 4a of the underlayer 4 with the adjusted liquid pressure of the metallic solution L in the housing 15. In this way, while the solid electrolyte membrane 13 presses the surface 5a and the side faces 5b of the seed layer 5 and the surface 4a of the underlayer 4, voltage is applied between the anode 11 and the underlayer 4. As a result, metal originating from the metal ions contained in the solid electrolyte membrane 13 is deposited on the surface 5a and the side faces 5b of the seed layer 5. The voltage applied reduces metal ions in the metallic solution L in the housing 15 continuously at the cathode, so that the metal layer 6 is formed in the solid electrolyte membrane 13.

The surface 4a of the underlayer 4 contains oxide, and such surface 4a of the underlayer 4 therefore presumably has higher activation energy for the reduction reaction of the metal ions than the surface 5a and the side faces 5b of the seed layer 5. With this configuration, although the solid electrolyte membrane 13 is in close contact with the surface 5a and the side faces 5b of the seed layer 5 and the surface 4a of the underlayer 4, the current flows only at the surface 5a and the side faces 5b of the seed layer 5. Metal ions (copper ions in this case) contained in the solid electrolyte membrane 13 therefore are reduced on the surface 5a and the side faces 5b, and the metal (copper in this case) is deposited there. As a result, the metal layer 6 is selectively formed only on the surface 5a and the side faces 5b of the seed layer 5 of the surface 5a and the side faces 5b of the seed layer 5 and the surface 4a of the underlayer 4.

Figure 7:
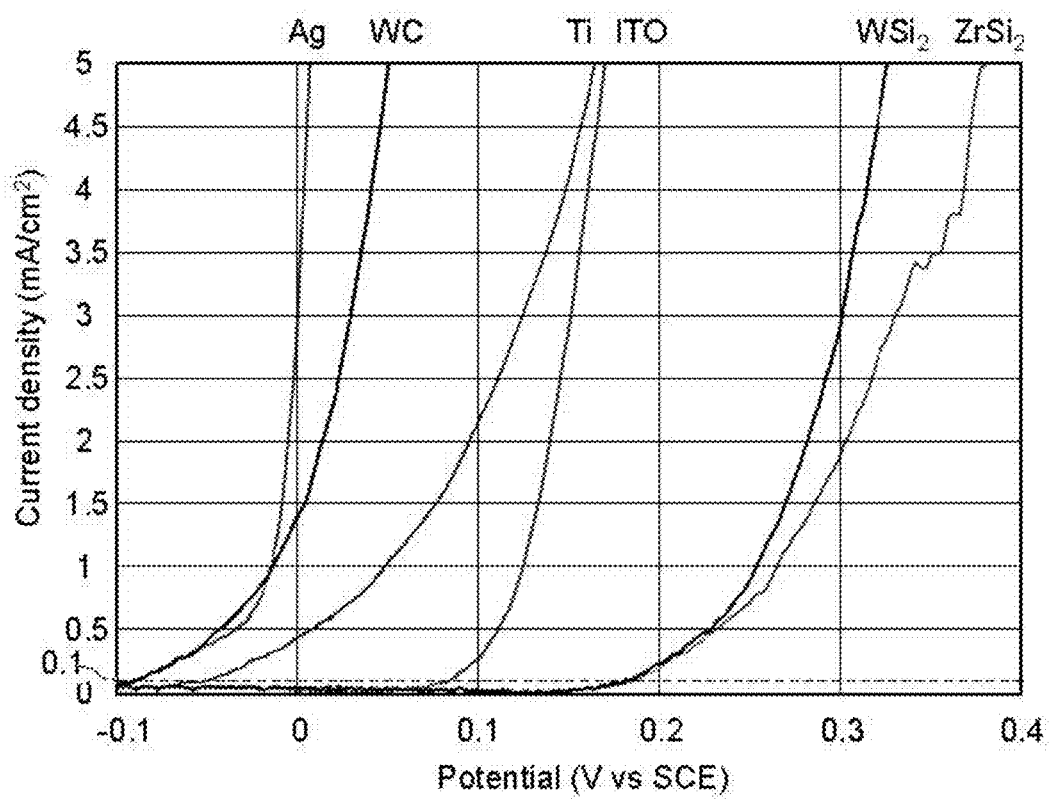
FIG. 7 shows polarization curves (polarization characteristics) of $WSi_2$, $ZrSi_2$, ITO, Ti, WC, and Ag (silver)

More specifically, as shown in FIG. 7, the rising potential of the polarization curve (first polarization curve) of the material (for example, $WSi_2$, $ZrSi_2$, ITO, and Ti) of the underlayer 4 is larger than the rising potential of the polarization curve (second polarization curve) of the material (in this case, silver) of the seed layer 5. This means that the surface 4a of the underlayer 4 has higher activation energy for the reduction reaction of metal ions than the surface 5a and the side faces 5b of the seed layer 5. The rising potential is the potential at which the current density starts to rise. It is difficult to specify the rising potential when the current density is closer to 0 $mA/cm^2$ (error will increase), so the potential corresponding to the current density of 0.1 $mA/cm^2$ is used as the rising potential in this case. The rising potential of the polarization curve of WC is substantially the same as the rising potential of the polarization curve (second polarization curve) of the material (in this case, silver) of the seed layer 5. WC therefore cannot be used as the underlayer 4. The polarization curves shown in FIG. 7 will be described later, with reference to Examples.

For example, a natural oxide film of $SiO_2$ is formed on the surface of $WSi_2$ and $ZrSi_2$. The potential at a current density of 0.1 $mA/cm^2$ in these polarization curves therefore is higher than the potential at a current density of 0.1 $mA/cm^2$ in the silver polarization curve by 0.02 V or more. This means that voltage of, e.g., 0.1 V applied between the anode 11 made of copper and the underlayer 4 made of $WSi_2$ or $ZrSi_2$ flows current through the seed layer 5 made of silver, and no current flows through the underlayer 4 made of $WSi_2$ or ZrSi$_2$. In other words, while current flows through the seed layer 5, no current flows through the underlayer 4 because the underlayer 4 includes oxide on the surface 4a and the activation energy of the surface 4a is relatively high as stated above. In this way, a difference in rising potential of the polarization curve between the underlayer 4 and the seed layer 5 is sufficiently large (about 0.02 V or more), and this allows selective formation of the metal layer 6 on the seed layer 5, i.e., only on the surface 5a and the side faces 5b of the seed layer 5 of the surface 5a and the side faces 5b of the seed layer 5 and the surface 4a of the underlayer 4 that are in close contact with the solid electrolyte membrane 13. In this way, the metal layer 6 is formed not only on the surface 5a of the seed layer 5 but also on the side faces 5b, and this improves the adhesion between the metal layer 6 and the seed layer 5 as compared with the case of the formation of the metal layer 6 only on the surface 5a of the seed layer 5.

When voltage is continuously applied between the anode 11 and the underlayer 4 in this state, the metal layer 6 is gradually formed on the surface 5a and the side faces 5b of the seed layer 5, and the thickness of the metal layer 6 increases. At this time, the metal layer 6 on each of the side faces 5b grows from the side face 5b in the direction along the surface 4a of the underlayer 4 (left-right direction in FIG. 8), and the metal layer 6 is formed on the surface 4a of the underlayer 4 only at a part close to the seed layer 5.

Figure 8:
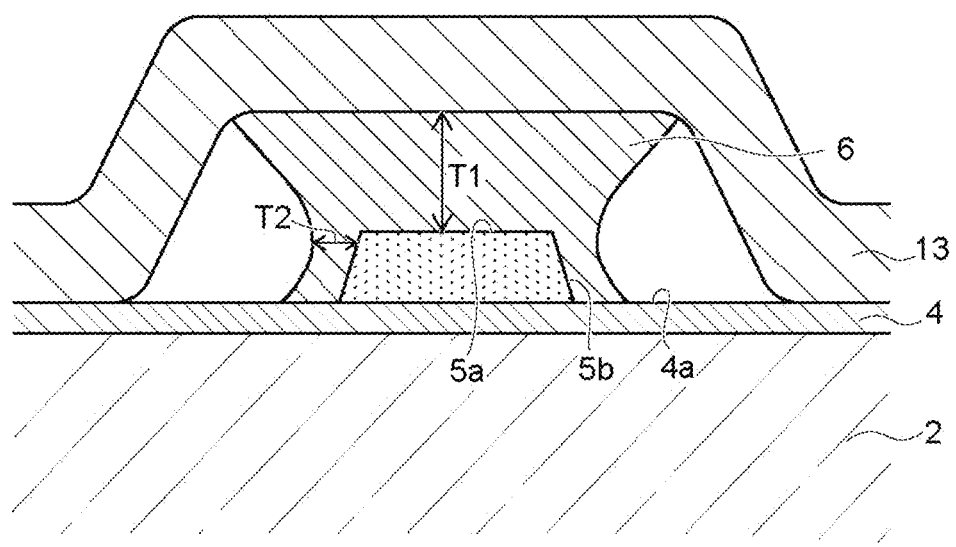
FIG. 8 is a cross-sectional view showing the solid electrolyte membrane that is away from the side faces of the seed layer.

When metal (copper in this case) is deposited on the surface 5a and the side faces 5b of the seed layer 5, current concentrates on both ends of the surface 5a of the seed layer 5 in FIG. 6. The metal layer 6 therefore grows in the width direction as well so that the metal layer 6 becomes wider in accordance with a distance from the seed layer 5. When the thickness of the metal layer 6 increases from the state of FIG. 6, the solid electrolyte membrane 13 has a distance from the lower ends of the side faces 5b of the seed layer 5 as shown in FIG. 8. The metal layer 6 therefore will not grow on the side faces 5b of the seed layer 5.

Continuously applied voltage between the anode 11 and the underlayer 4 therefore results in the shape of the metal layer 6 as shown in FIG. 8. Specifically, thickness T1 of the metal layer 6 on the surface 5a of the seed layer 5 is larger than thickness T2 of the metal layer 6 on the side face 5b.

When the metal layer 6 is formed to have predetermined thickness T1, application of voltage between the anode 11 and the underlayer 4 is stopped, and pressurization of the metallic solution L by the pump 102 is stopped. Then, the housing 15 is raised to a predetermined height, and the substrate 2 is removed from the metallic mount 40.

As stated above, the metal-layer formation step S3 forms the metal layer 6 by electrolytic plating, and this increases the film-deposition rate and so shortens the plating time as compared with the case of forming the metal layer 6 by electroless plating.

The removing step S4 removes the exposed region R without the seed layer 5 and the metal layer 6 of the underlayer 4 without using a mask, so that the wiring layer 3 including the underlayer 4b, the seed layer 5 and the metal layer 6 is formed on the surface of the substrate 2. The method for removing the exposed region R is not limited especially, and various methods, such as plasma etching, sputtering, and chemical etching, may be used. In one example, when the underlayer 4 is made of WSi$_2$ or ZrSi$_2$, the exposed region R is removed by plasma etching using CF$_4$ gas in some embodiments.

The line/space of the wiring layer 3 is not particularly limited. In one example, when the space of the seed layer 5 is 2 μm, about 1 μm is kept for the space of the wiring layer 3. From this point of view, when the line/space of the seed layer 5 is 2 μm or more and 100 μm or less/2 μm or more and 100 μm or less, for example, the line/space of the wiring layer 3 will be 3 μm or more and 101 μm or less/1 μm or more and 99 μm or less. The wiring board 1 having such fine wiring is suitable for high-density mounting. The line/space is the wiring width W1/wiring space W2 in a plan view of the wiring board 1 (see FIG. 9).

Figure 9:
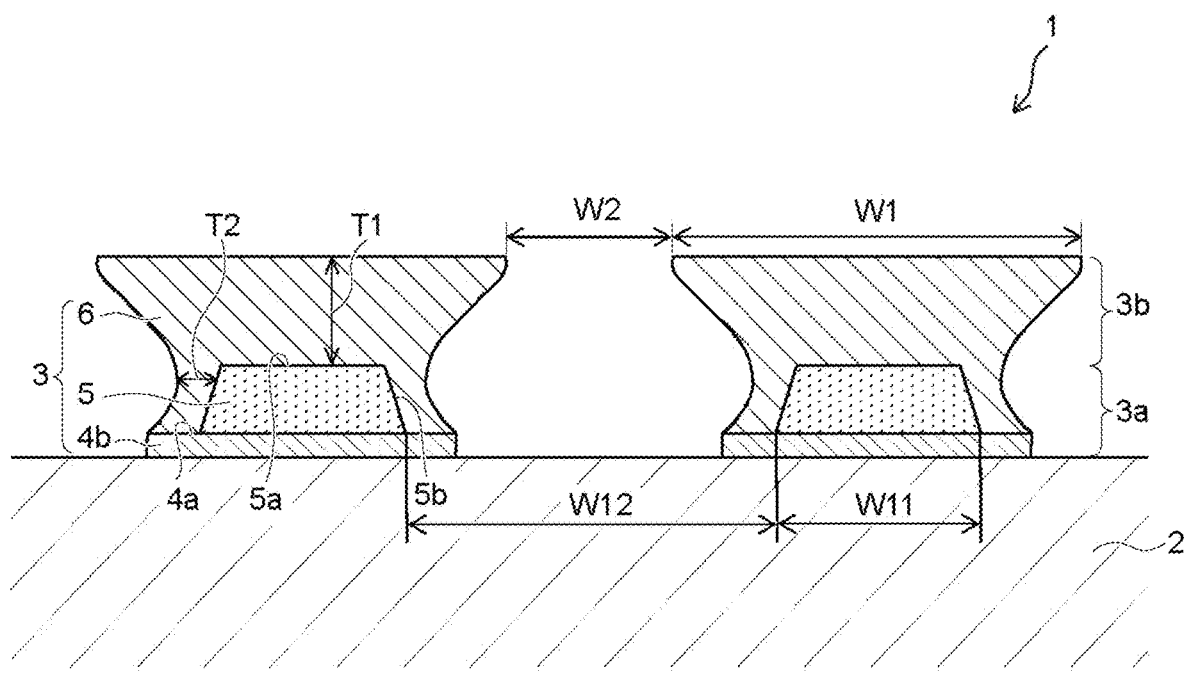
FIG. 9 is a cross-sectional view showing the structure of a wiring layer in a wiring board according to one embodiment of the present disclosure.

As shown in FIG. 9, the wiring layer 3 is formed in a taper shape (trapezoidal shape in FIG. 9) that tapers in accordance with a distance from the substrate 2 in a portion 3a closer to the substrate 2 than the surface 5a of the seed layer 5. The wiring layer 3 is formed in a reverse taper shape (reverse trapezoidal shape in FIG. 9) that becomes thicker in accordance with a distance from the substrate 2 in a portion 3b farther from the substrate 2 than the surface 5a of the seed layer 5. The width of the taper-shaped part (portion 3a) of the metal layer 6 is smaller than the width of the reverse taper-shaped part (portion 3b) of the metal layer 6. This keeps the wiring width with the reverse taper-shaped part, and widens the wiring interval (wiring interval in the vicinity of the surface of the substrate 2) between the taper-shaped parts. This therefore keeps insulation reliability between the wirings.

Thickness T1 of the metal layer 6 on the surface 5a of the seed layer 5 is larger than thickness T2 of the metal layer 6 on the side face 5b. This keeps the thickness of the wiring layer 3 without narrowing the wiring interval of the wiring layer 3, and so easily keeps the insulation reliability between the wirings. In one example, thickness T1 of the metal layer 6 on the surface 5a is 1 μm or more and 100 μm or less, and thickness T2 of the metal layer 6 on the side face 5b is 2 μm or less. Thickness T1 of the metal layer 6 that is 1 μm or more avoids too large wiring resistance even when the wiring layer 3 is fine wiring. Thickness T1 of the metal layer 6 that is 100 μm or less avoids too long time (plating time) required to form the metal layer 6.

In this way the method manufactures the wiring board 1 shown in FIG. 9.

In the present embodiment, the solid electrolyte membrane 13 is pressed against the seed layer 5 and the underlayer 4, and voltage is applied between the anode 11 and the underlayer 4 as described above. This reduces metal ions contained in the solid electrolyte membrane 13 so as to form the metal layer 6 on the surface 5a and the side faces 5b of the seed layer 5. To form the metal layer 6 on the surface 5a of the seed layer 5, the solid electrolyte membrane 13 is pressed against the seed layer 5 and the underlayer 4. At this time, the solid electrolyte membrane 13 comes into close contact with the underlayer 4 as well as the seed layer 5. The surface 4a of the underlayer 4 contains oxide, and such a surface 4a of the underlayer 4 therefore presumably has higher activation energy for the reduction reaction of the metal ions than the surface (surface 5a and side faces 5b) of the seed layer 5. This selectively forms the metal layer 6 only on the surface of the seed layer 5 of the seed layer 5 and the underlayer 4, and so enables the formation of the metal layer 6 on the surface of the seed layer 5 without using a resin resist pattern. The exposed region R of the underlayer 4 without the seed layer 5 and the metal layer 6 is then removed, and this forms the wiring layer 3 having a predetermined wiring pattern on the surface of the substrate 2. As stated above, the method forms the metal layer 6 on the surface of the seed layer 5 without using a resin resist pattern, and so the method does not need the formation and removal of a resist pattern. As a result, the method does not require a lot of steps to manufacture the wiring board 1 and does not generate a large amount of liquid waste.

While the solid electrolyte membrane 13 is pressed against the seed layer 5 and the underlayer 4, voltage is applied between the anode 11 and the underlayer 4. This forms the metal layer 6 while deforming the solid electrolyte membrane 13 so as to follow the shapes of the seed layer 5 and the underlayer 4. As a result, the metal layer 6 is formed on the surface 5a as well as the side faces 5b of the seed layer 5, so that the metal layer 6 is formed to cover the surface 5a and the side faces 5b of the seed layer 5. This improves the adhesion between the metal layer 6 and the seed layer 5 as compared with the case of the formation of the metal layer 6 only on the surface 5a of the seed layer 5.

EXAMPLES

The following describes Examples of the present disclosure.
<Material of Seed Layer>

Example 1

The wiring board 1 was manufactured by the above-described manufacturing method, using glass as the material of the substrate 2, $WSi_2$ as the material of the underlayer 4, silver as the material of the seed layer 5, and copper as the material of the metal layer 6. Specifically, the underlayer 4 made of $WSi_2$ was formed on the surface of a substrate 2 made of glass by sputtering using $WSi_2$ as a target. At this time, the thickness of the underlayer 4 was 100 nm. Then, the seed layer 5 having the thickness of 100 nm was formed on the surface of the underlayer 4 using ink containing silver nanoparticles having the average particle diameter of 50 nm. At this time, the ink was disposed on the surface of the underlayer 4 by screen printing, and the silver nanoparticles were sintered at the temperature of 120° C. to form the seed layer 5. The seed layer 5 was formed to have a plurality of independent patterns 5c.

Next, the metal layer 6 was formed on the surface 5a of the seed layer 5 by the film-deposition apparatus 100. 1.0 mol/L copper sulfate aqueous solution was used as the metal solution L, oxygen-free copper wire was used as the anode 11, and Nafion (registered trademark) (thickness of about 8 μm) was used as the solid electrolyte membrane 13. While the solid electrolyte membrane 13 was pressed against the seed layer 5 with 1.0 MPa by the pump 102, the metal layer 6 was formed at the current density of 0.23 mA/cm² with an applied voltage of about 0.5 V (constant current control of about 100 mA). Thickness T1 of the metal layer 6 was 5 μm.

After that, the exposed region R of the underlayer 4 without the seed layer 5 and the metal layer 6 was removed by vacuum plasma etching using $CF_4$ gas. The wiring board 1 of Example 1 was obtained in this way.

Example 2

The material of the underlayer 4 was $ZrSi_2$. Otherwise, the manufacturing method was the same as in Example 1.

Example 3

The material of the underlayer 4 was ITO. Otherwise, the manufacturing method was the same as in Example 1.

Example 4

The material of the underlayer 4 was Ti. Otherwise, the manufacturing method was the same as in Example 1.

Comparative Example 1

The material of the underlayer 4 was WC. Otherwise, the manufacturing method was the same as in Example 1.

Figure 10:
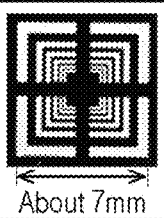
FIG. 10 shows photos from the above, showing the wiring layers in Examples 1 to 4 and Comparative Example 1.
Figure 10:
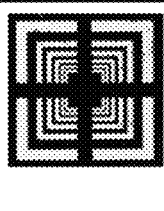
Figure 10:
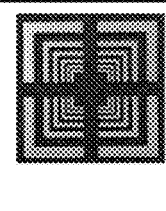
Figure 10:
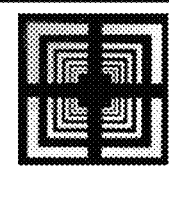
Figure 10:
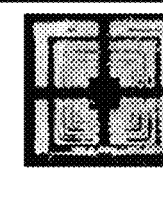

Then, the wiring layers 3 in Examples 1 to 4 and Comparative Example 1 were observed. FIG. 10 shows the results.

As shown in FIG. 10, the wiring layers 3 in Examples 1 to 4 were favorably formed. Specifically, copper (metal layer 6) was not formed in the region without the seed layer 5 (exposed region R of the underlayer 4), and was formed only on the seed layer 5. The copper (metal layer 6) was uniformly formed on the seed layer 5, and the seed layer 5, for example, was not exposed. On the contrary, deposition of copper (metal layer 6) was found also in the region without the seed layer 5 (the region on WC) in Comparative Example 1. This shows that the metal layer 6 was selectively deposited in Examples 1 to 4, and the metal layer 6 was not (or less) selectively deposited in Comparative Example 1.

To examine the cause, polarization curves (polarization characteristics) of $WSi_2$, $ZrSi_2$, ITO, Ti, WC and silver were examined. Specifically, copper sulfate solution having concentration of 1 mol/L at the temperature of 25° C. was used as an electrolyte, oxygen-free copper wire was used as a counter electrode, and a saturated calomel electrode (HC-205C manufactured by DKK-TOA Co.) was used as a reference electrode. Then the polarization curves (polarization characteristics) were measured by setting the potential sweep rate at 10 mV/sec, and using a potentiostat (HZ-7000 manufactured by Hokuto Denko Co.) with $WSi_2$, $ZrSi_2$, ITO, Ti, WC or silver as the working electrode. At this time, a beaker was used as the electrolytic cell, the amount of electrolyte was 1.0 L, and the agitation rate was 300 rpm. As a result, the polarization curves (polarization characteristics) of $WSi_2$, $ZrSi_2$, ITO, Ti, WC and silver were as shown in FIG. 7.

As shown in FIG. 7, differences in the rising potential of $WSi_2$, $ZrSi_2$, ITO, Ti, and WC relative to the rising potential of silver were about 0.25 V, about 0.25 V, about 0.18 V, about 0.02 V, and about 0 V, respectively. The rising potential in this case was the potential at the current density of 0.1 mA/cm².

This shows that a material having a rising potential difference of about 0.02 V or more relative to the material of the seed layer 5 (in this case, silver) when the current density is 0.1 mA/cm² may be used as the material of the underlayer 4, and this enables the formation of the metal layer 6 only on the seed layer 5 and not in the region without the seed layer 5 (exposed region R of the underlayer 4). Such an underlayer 4 having a large rising potential difference relative to the seed layer 5 increases the selectivity of deposition during the formation of the metal layer 6. This prevents the deposition of the metal layer 6 on the underlayer 4 even when the metal layer 6 is formed with a larger current density, and so shortens the time required to form the metal layer 6.

<Cross-Sectional Shape of Wiring Layer>

Example 5

The material of the substrate 2 was glass epoxy resin, and thickness T1 of the metal layer 6 on the surface 5a of the seed layer 5 was 10 μm. Otherwise, the manufacturing method was the same as in Example 1. Then, the cross section of the wiring layer 3 in Example 5 was observed.

Similarly to the schematic cross-sectional view of FIG. 9, the metal layer 6 of Example 5 had a shape to cover the surface 5a and the side faces 5b of the seed layer 5. Thickness T1 of the metal layer 6 on the surface 5a of the seed layer 5 was larger than thickness T2 of the metal layer 6 on the side face 5b. Thickness T1 of the metal layer 6 on the surface 5a was 10 μm, and thickness T2 of the metal layer 6 on the side face 5b was 2 μm or less.

The wiring layer 3 was formed in a taper shape (trapezoidal shape in FIG. 9) that tapered in accordance with a distance from the substrate 2 in a portion 3a closer to the substrate 2 than the surface 5a of the seed layer 5. The wiring layer 3 was formed in a reverse taper shape (reverse trapezoidal shape in FIG. 9) that became thicker in accordance with a distance from the substrate 2 in a portion 3b farther from the substrate 2 than the surface 5a of the seed layer 5. The width of the taper-shaped part (portion 3a) of the wiring layer 3 was smaller than the width of the reverse taper-shaped part (portion 3b) of the wiring layer 3.

<Optimum Thicknesses of Underlayer and Seed Layer>

Example 6

The thickness of the seed layer 5 was 300 nm. Otherwise, the manufacturing method was the same as in Example 1.

Example 7

The thickness of the seed layer 5 was 20 nm. Otherwise, the manufacturing method was the same as in Example 1.

Example 8

The thickness of the underlayer 4 was 300 nm. Otherwise, the manufacturing method was the same as in Example 1.

Example 9

The thickness of the underlayer 4 was 20 nm. Otherwise, the manufacturing method was the same as in Example 1.

Example 10

The thickness of the seed layer 5 was 10 nm. Otherwise, the manufacturing method was the same as in Example 1.

Example 11

The thickness of the underlayer 4 was 10 nm. Otherwise, the manufacturing method was the same as in Example 1.

Figure 11:
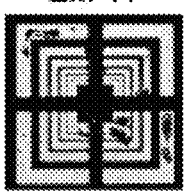
FIG. 11 shows photos from the above, showing the wiring layers in Examples 1 and 6 to 11.
Figure 11:
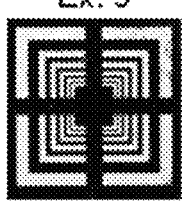
Figure 11:
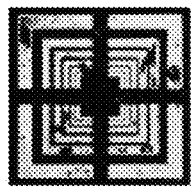
Figure 11:
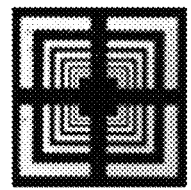
Figure 11:
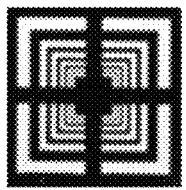
Figure 11:
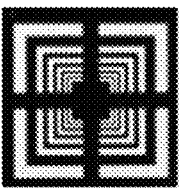
Figure 11:
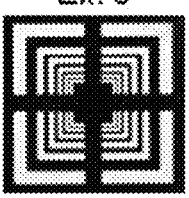

In Examples 6, 7, and 10, the thickness of the seed layer 5 was adjusted by adjusting the coating amount of the ink. In Examples 8, 9, and 11, the thickness of the underlayer 4 was adjusted by adjusting the sputtering time. Then, the wiring layers 3 in Example 1, 6~11 were observed. FIG. 11 shows the results.

As shown in FIG. 11, the wiring layers 3 in Examples 1, 6 to 9 were favorably formed. Specifically, the copper (metal layer 6) was not formed in the region without the seed layer 5 (exposed region R of the underlayer 4), and was formed only on the seed layer 5. The copper (metal layer 6) was uniformly formed on the seed layer 5, and the seed layer 5, for example, was not exposed. It was therefore found that the wiring board 1 can be favorably formed by setting the thickness of the underlayer 4 at 20 nm or more and 300 nm or less and the thickness of the seed layer 5 at 20 nm or more and 300 nm or less.

In Examples 10 and 11, copper (metal layer 6) was not formed in the region without the seed layer 5 (exposed region R of the underlayer 4), and was formed only on the seed layer 5. However, the copper (metal layer 6) was not formed in a partial region on the seed layer 5, meaning that unevenness occurred. The degree of unevenness occurred at a part of the copper (metal layer 6) as in Examples 10 and 11 does not pose a problem of the wiring board 1 for use.

The wiring board 1 having a thickness of the underlayer 4 more than 300 nm and a thickness of the seed layer 5 more than 300 nm can be still favorably formed. This, however, degrades the cost effectiveness because the material cost and the process cost required for forming the underlayer 4 and the seed layer 5 and removing the underlayer 4 increase.

Example 12

The material of the substrate 2 was glass epoxy resin, and the center-line average roughness Ra of the substrate 2 was 0.1 μm. Otherwise, the manufacturing method was the same as in Example 1.

Example 13

The center-line average roughness Ra of the substrate 2 was 0.5 μm. Otherwise, the manufacturing method was the same as in Example 12.

Example 14

The center-line average roughness Ra of the substrate 2 was 1.0 μm. Otherwise, the manufacturing method was the same as in Example 12.

Example 15

The center-line average roughness Ra of the substrate 2 was 1.2 μm. Otherwise, the manufacturing method was the same as in Example 12.

Comparative Example 2

The material of the substrate 2 was glass epoxy resin, and the center-line average roughness Ra of the substrate 2 was 0.1 μm. Then, copper wiring was formed on the surface of the substrate 2 by electroless plating using a known semi-additive method.

Comparative Example 3

The center-line average roughness Ra of the substrate 2 was 0.5 μm. Otherwise, the manufacturing method was the same as in Comparative Example 2.

Comparative Example 4

The center-line average roughness Ra of the substrate 2 was 1.0 μm. Otherwise, the manufacturing method was the same as in Comparative Example 2.

Comparative Example 5

The center-line average roughness Ra of the substrate 2 was 1.2 μm. Otherwise, the manufacturing method was the same as in Comparative Example 2.

The center line average roughness Ra of the substrate 2 in Examples 12 to 15 and Comparative Examples 2 to 5 was adjusted during the manufacturing of the substrate 2. Then a peeling test was conducted to Examples 12 to 15 and Comparative Examples 2 to 5. The width of the wiring layer 3 was set at 10 mm, and the wiring layer 3 was pulled in the direction perpendicular to the substrate 2.

Figure 12:
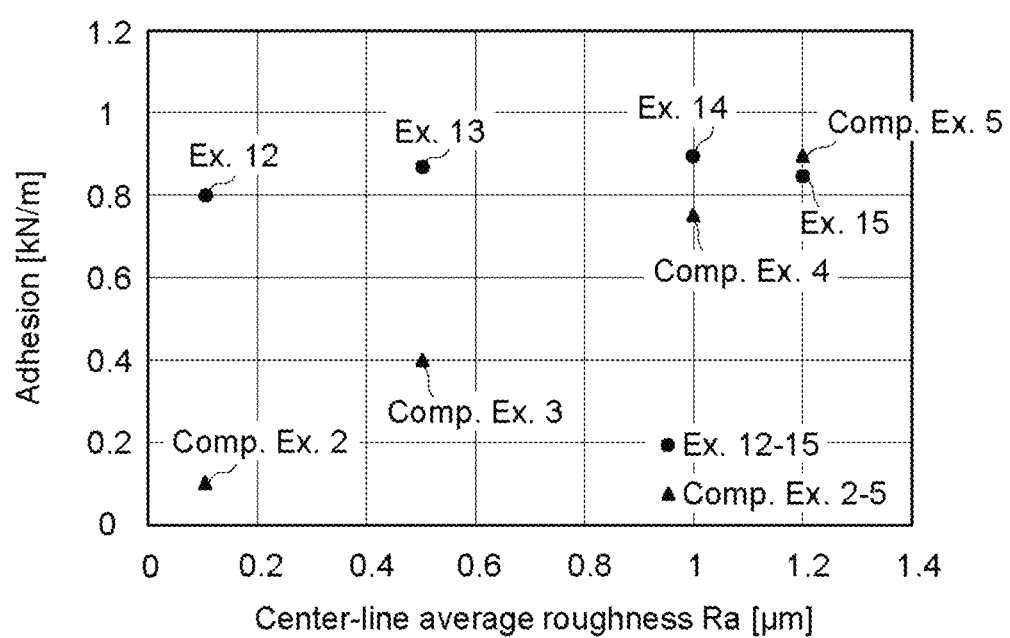
FIG. 12 shows the result of the peeling test for Examples 12 to 15 and Comparative Examples 2 to 5.

As shown in FIG. 12, the adhesion of the wiring layer 3 to the substrate 2 in Examples 12 to 15 was about 0.8 kN/m, about 0.87 kN/m, about 0.9 kN/m, and about 0.85 kN/m, respectively. In all of Examples 12 to 15, breakage (peeling) occurred inside the substrate 2. In this way, it was found that the wiring layers 3 in Examples 12 to 15 were firmly bonded to the substrate 2 regardless of the center-line average roughness Ra of their substrates 2.

The adhesion of the wiring layer 3 to the substrate 2 in Comparative Examples 2 to 5 was about 0.1 kN/m, about 0.4 kN/m, about 0.64 kN/m, and about 0.89 kN/m, respectively. In Comparative Examples 2 to 4, peeling occurred at the interface between the wiring layer 3 (copper wiring by electroless plating) and the substrate 2, and breakage (peeling) occurred inside the substrate 2 only in Comparative Example 5. In this way, it was found that, when the center-line average roughness Ra of the substrate 2 was 1.0 μm or less, Comparative Examples 2 to 5 had the difficulty of firmly bonding the wiring layers 3 (copper wiring by electroless plating) to the substrate 2. On the contrary, the manufacturing method of the present embodiment was able to firmly bond the wiring layers 3 to the substrate 2 as shown in Examples 12 to 15, even when the center-line average roughness Ra of the substrate 2 was 1.0 μm or less. The manufacturing method of the present embodiment is therefore particularly effective when the center-line average roughness Ra of the substrate 2 is 1.0 μm or less.

The adhesion of the wiring layer 3 to the substrate 2 in Examples 12 to 15 was improved because these Examples formed the underlayer 4 on the surface of the substrate 2 by sputtering, and this firmly bonded the substrate 2 and the underlayer 4 due to the covalent bond of Si—O. Similarly, the formation of the underlayer 4 on the surface of the substrate 2 by evaporation also firmly bonds the substrate 2 and the underlayer 4 due to the covalent bond, and this also improves the adhesion of the wiring layer 3 to the substrate 2.

Example 16

The material of the underlayer 4 was $ZrSi_2$, and the thickness of the underlayer 4 was 100 nm. Otherwise, the manufacturing method was the same as in Example 1. Then, the wiring layer 3 in Example 16 was observed.

Figure 13:
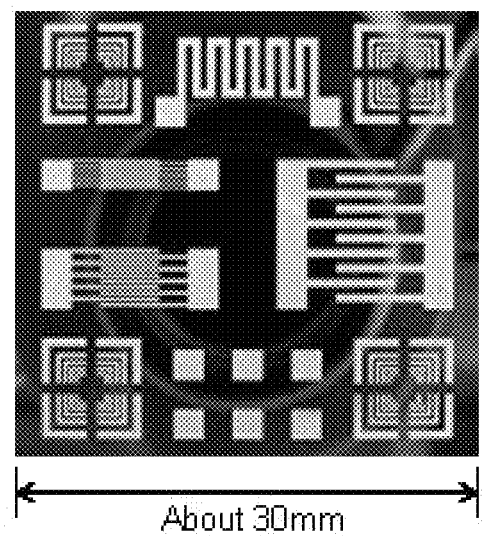
FIG. 13 shows photos from the above, showing the wiring layer in Example 16.

As shown in FIG. 13, the wiring layer 3 in Example 16 was favorably formed. Specifically, copper (metal layer 6) was not formed in the region without the seed layer 5 (exposed region R of the underlayer 4), and was formed only on the seed layer 5. The copper (metal layer 6) was uniformly formed on the seed layer 5, and the seed layer 5, for example, was not exposed.

The embodiment disclosed here is to be considered in all respects as illustrative and not restrictive. The scope of the present disclosure is defined by the claims and not by the embodiment, and is intended to include any modification within the meaning and scope equivalent to the terms of the claims.

For example, the above embodiment shows an example of having the wiring layer 3 only on one surface of the substrate 2, and the present disclosure is not limited to this. In another example, a wiring layer 3 may be provided on one surface and the other surface of the substrate 2 (both of the upper and lower faces) to form a two-layered substrate. In another embodiment, the substrate may be a multilayer substrate having four layers (or four layers or more).

The above embodiment describes an example of the manufacturing method of the wiring board 1 including the underlayer formation step S1 and the seed-layer formation step S2. That is, the above embodiment describes the example of including the step of forming the underlayer 4 on the surface of the substrate 2 and the step of forming the seed layer 5 on the surface of the underlayer 4. The present disclosure is not limited to this, and the method may prepare the substrate 2 having the underlayer 4 on the surface, and then form the seed layer 5 on the surface of the underlayer 4, or may prepare the substrate 2 having the lamination of the underlayer 4 and the seed layer 5 on the surface and then form the metal layer 6 on the surface of the seed layer 5.

All publications, patents and patent applications cited in the present description are herein incorporated by reference as they are.

DESCRIPTION OF SYMBOLS

1 Wiring board
2 Substrate
3 Wiring layer
3a, 3b Portion
4, 4b Underlayer
4a Surface
5 Seed layer
5a Surface
5b Side face
5c Independent pattern
6 Metal layer
9 Substrate with seed-layer
11 Anode
13 Solid electrolyte membrane
L Metallic solution
R Exposed region
T1, T2 Thickness

What is claimed is:

1. A method for manufacturing a wiring board including an insulating substrate, and a wiring layer with a predetermined wiring pattern disposed on the surface of the insulating substrate, the method comprising:

preparing a substrate with seed-layer, the substrate with seed-layer including: an electrically conductive underlayer on the surface of the insulating substrate; and a seed layer with a predetermined pattern corresponding to the wiring pattern on the surface of the underlayer, the seed layer containing metal;

disposing a solid electrolyte membrane between an anode and the seed layer as a cathode, pressing the solid electrolyte membrane against the seed layer and the underlayer, and applying voltage between the anode and the underlayer to reduce metal ions contained in the solid electrolyte membrane and so form a metal layer on the surface of the seed layer; and removing an exposed region of the underlayer without the seed layer and the metal layer to form the wiring layer including the underlayer, the seed layer and the metal layer on the surface of the insulating substrate, and so manufacture the wiring board, during formation of the metal layer on the surface of the seed layer, at least a region of the surface of the underlayer, on which the seed layer is not formed, containing oxide.

2. The method for manufacturing the wiring board according to claim 1, wherein during formation of the metal layer on the surface of the seed layer, a natural oxide film including the oxide is formed in at least a region of the surface of the underlayer, on which the seed layer is not formed.

3. The method for manufacturing the wiring board according to claim 1, wherein when copper sulfate solution with concentration of 1 mol/L at a temperature of 25° C. is used as an electrolyte, oxygen-free copper wire is used as a counter electrode, a saturated calomel electrode is used as a reference electrode, and a first polarization curve using the material of the underlayer as a working electrode and a second polarization curve using the metal of the seed layer as a working electrode are measured while setting a potential sweep rate at 10 mV/sec, potential of the first polarization curve at a current density of 0.1 mA/cm2 is higher than potential of the second polarization curve at a current density of 0.1 mA/cm2 by 0.02 V or more.

4. The method for manufacturing the wiring board according to claim 1, wherein when preparing the substrate with seed-layer,
the method prepares a substrate including a surface with center-line average roughness Ra of 1 μm or less as the insulating substrate, and
forms the underlayer by sputtering on the surface of the insulating substrate.

5. The method for manufacturing the wiring board according to claim 4, wherein the seed layer is formed on the surface of the underlayer so that line/space is 2 μm or more and 100 μm or less/2 μm or more and 100 μm or less.

6. The method for manufacturing the wiring board according to claim 1, wherein when preparing the substrate with seed-layer, the method places ink containing metal nanoparticles on the surface of the underlayer, and then sinters the metal nanoparticles to form the seed layer.

7. The method for manufacturing the wiring board according to claim 1, wherein when preparing the substrate with seed-layer, the method forms the seed layer on the surface of the underlayer so that the predetermined pattern of the seed layer has a plurality of independent patterns that are spaced away from each other.

* * * * *